United States Patent
Sumi

(10) Patent No.: US 10,798,859 B2
(45) Date of Patent: Oct. 6, 2020

(54) COMPONENT MOUNTING METHOD

(71) Applicant: Panasonic Intellectual Property Management Co., Ltd., Osaka (JP)

(72) Inventor: Hideki Sumi, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 265 days.

(21) Appl. No.: 15/785,516

(22) Filed: Oct. 17, 2017

(65) Prior Publication Data

US 2018/0124962 A1 May 3, 2018

(30) Foreign Application Priority Data

Oct. 27, 2016 (JP) .................. 2016-210371

(51) Int. Cl.
*H05K 13/08* (2006.01)
*H05K 13/04* (2006.01)
*H05K 13/00* (2006.01)

(52) U.S. Cl.
CPC ..... *H05K 13/0853* (2018.08); *H05K 13/0061* (2013.01); *H05K 13/0411* (2018.08)

(58) Field of Classification Search
CPC ........... H05K 13/0411; H05K 13/0857; H05K 13/0853
See application file for complete search history.

(56) References Cited

U.S. PATENT DOCUMENTS

| 2010/0325860 | A1* | 12/2010 | Maenishi | ............. | H05K 13/085 |
|---|---|---|---|---|---|
| | | | | | 29/407.01 |
| 2012/0240388 | A1 | 9/2012 | Ishimoto | | |
| 2016/0081242 | A1 | 3/2016 | Mawatari | | |

FOREIGN PATENT DOCUMENTS

| JP | 2009-239257 A | 10/2009 |
|---|---|---|
| JP | 4772906B B2 | 9/2011 |
| JP | 5212347 B2 | 6/2013 |
| JP | 2016-063036 A | 4/2016 |

* cited by examiner

*Primary Examiner* — Livius R. Cazan
(74) *Attorney, Agent, or Firm* — Pearne & Gordon LLP

(57) ABSTRACT

A component mounting method includes independent mounting and cross lane alternate mounting. The independent mounting performs an operation of mounting a component on a first board carried in a first board transport lane from a first component supplier, and an operation of mounting a component on a second board carried in a second board transport lane from a second component supplier. The cross lane alternate mounting alternately performs an operation of mounting the component on the first board carried in the first board transport lane from the second component supplier, and an operation of mounting the component on the second board carried in the second board transport lane from the first component supplier.

6 Claims, 10 Drawing Sheets

(a)

(b)

(c)

COMPONENT MOUNTING METHOD

BACKGROUND

1. Technical Field

The present disclosure relates to a component mounting method in a component mounting apparatus having a plurality of board transport lanes, a plurality of mounting heads, and a plurality of component suppliers.

2. Description of the Related Art

In the related art, a component mounting apparatus having two board transport lanes that transport boards, two component suppliers that supply components, and two mounting heads that suck the components supplied by the component suppliers and mount the components on boards carried in the board transport lanes has been known (for example, see Japanese Patent No. 4772906). The component mounting apparatus of Japanese Patent No. 4772906 selects one mounting form in advance based on processing time or the like among four mounting forms of asynchronous transport independent mounting, asynchronous transport alternate lane mounting, synchronous transport carry-over mounting, and asynchronous transport carry-over mounting, and performs a set-up change for changing a component arrangement of the component supplier according to the selected mounting form.

In the asynchronous transport independent mounting, two board transport lanes asynchronously transport the boards and each mounting head mounts the component only on a board on a side close thereto. In the asynchronous transport alternate lane mounting, two board transport lanes asynchronously transport the boards and both the mounting heads alternately mount the component on each board. In the synchronous transport carry-over mounting, two board transport lanes synchronously transport the boards and the component is mounted on a board being mounted by one mounting head by the other mounting head while each mounting head mounts the component on the board on the side close thereto. In the asynchronous transport carry-over mounting, two board transport lanes asynchronously transport the boards and the component is mounted on a board being mounted by one mounting head by the other mounting head while each mounting head mounts the component on the board on the side close thereto.

SUMMARY

A component mounting method of the disclosure includes a component mounting apparatus.

The component mounting apparatus includes a first board transport lane, a first mounting head, a second board transport lane which is disposed along the first board transport lane, a second mounting head, a first component supplier which is disposed closer to the first board transport lane than to the second board transport lane, and a second component supplier which is disposed closer to the second board transport lane than to the first board transport lane.

The component mounting method includes independent mounting and cross lane alternate mounting.

The independent mounting independently performs an operation of sucking a component from the first component supplier by the first mounting head, and mounting the component on a first board carried in the first board transport lane, and an operation of sucking a component from the second component supplier by the second mounting head, and mounting the component on a second board carried in the second board transport lane.

The cross lane alternate mounting alternately performs an operation of sucking a component from the second component supplier by the second mounting head, and mounting the component on the first board carried in the first board transport lane, and an operation of sucking a component from the first component supplier by the first mounting head, and mounting the component on the second board carried in the second board transport lane.

DETAILED DESCRIPTION

Figure 1:
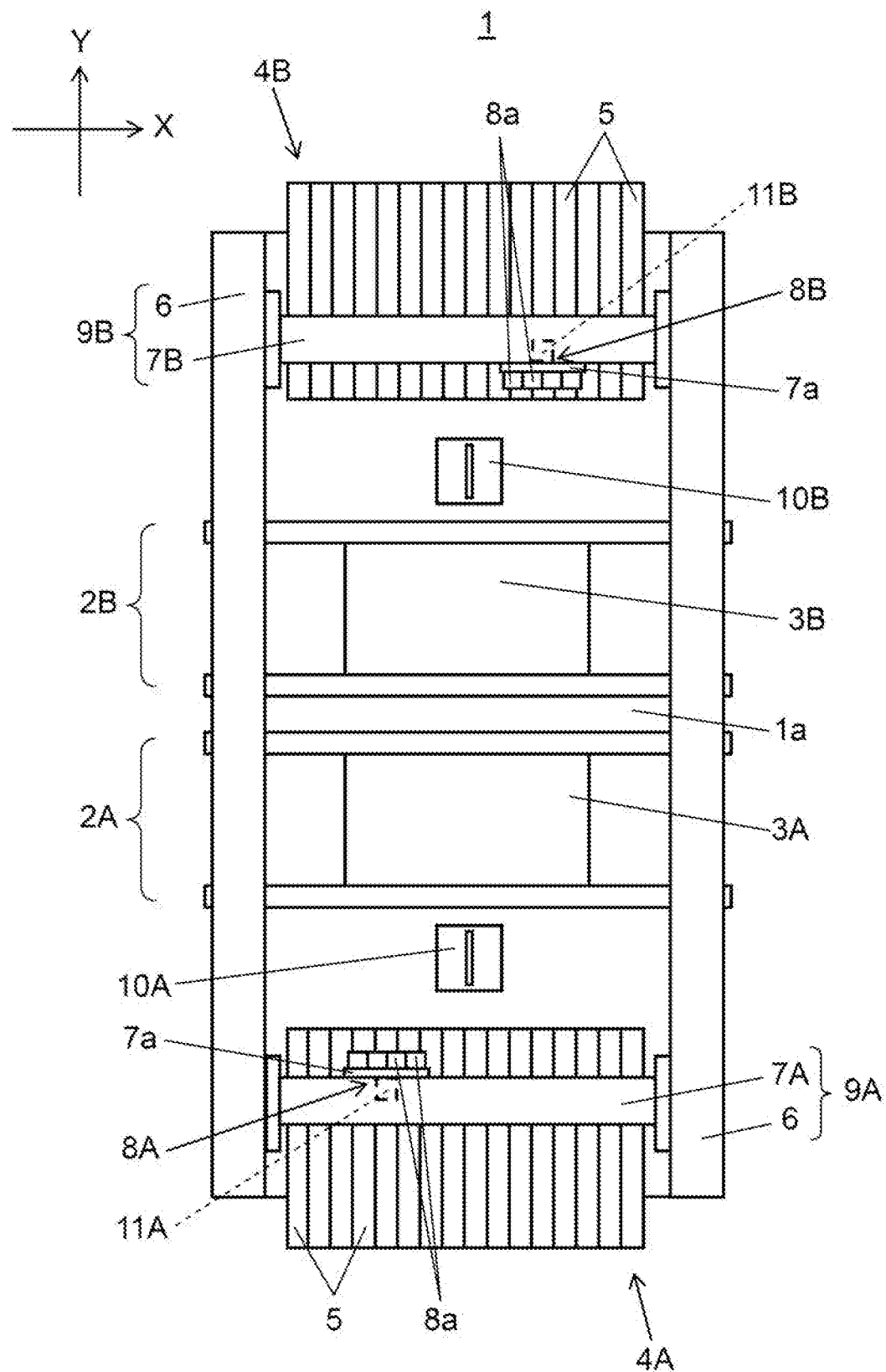
FIG. 1 is a plan view of a component mounting apparatus of an embodiment.

Hereinafter, an embodiment of the disclosure will be described in detail with reference to the drawings. Configurations, shapes, and the like described below are examples for explanation, and can be appropriately changed in accordance with the specifications of the component mounting apparatus. In the following description, the same reference numerals are given to corresponding elements in all drawings and redundant explanations will be omitted. In FIG. 1 and in a part to be described later, as two axial directions orthogonal to each other in a horizontal plane, an X direction (rightward and leftward direction in FIG. 1) indicates a board transport direction and a Y direction (upward and downward direction in FIG. 1) indicates a direction orthogonal to the board transport direction.

First, component mounting apparatus 1 will be described with reference to FIG. 1. First board transport lane 2A and second board transport lane 2B extending in the X direction are provided at a center portion of base 1a in a state of being in parallel in the Y direction. First board transport lane 2A and second board transport lane 2B transfer first board 3A and second board 3B carried in from upstream respectively, to a mounting working position to be positioned and held.

Hereinafter, for the sake of convenience, first board transport lane 2A and second board transport lane 2B are simply referred to as "board transport lanes 2A and 2B" unless it is necessary to distinguish therebetween. In addition, first board 3A and second board 3B are simply referred to as "boards 3A and 3B".

First component supplier 4A and second component supplier 4B are respectively disposed on the sides of board transport lanes 2A and 2B. Hereinafter, for the sake of convenience, first component supplier 4A and second component supplier 4B are simply referred to as "component suppliers 4A and 4B" unless it is necessary to distinguish therebetween. A plurality of tape feeders 5 are mounted in component suppliers 4A and 4B in parallel in the X direction. Tape feeder 5 pitch-feeds a carrier tape storing a component in a direction (tape feeding direction) from the outside of component suppliers 4A and 4B to board transport lanes 2A and 2B, thereby supplying the component at a position at which the component is picked up by a mounting head described later.

In FIG. 1, Y-axis beams 6 having linear drive mechanisms are respectively disposed at both end portions on an upper surface of base 1a in the X direction. First X-axis beam 7A and second X-axis beam 7B having similar linear drive mechanisms are coupled to two Y-axis beams 6 to move freely in the Y direction. First mounting head 8A is mounted on first X-axis beams 7A to move freely in the X direction. Second mounting head 8B is mounted on second X-axis beams 7B to move freely in the X direction. First mounting head 8A and second mounting head 8B has a plurality of suction units 8a on which suction nozzles which suck and hold the component at each of lower ends are mounted.

Y-axis beam 6 and first X-axis beam 7A configure first head moving mechanism 9A for moving first mounting head 8A in the X direction and the Y direction. Y-axis beam 6 and second X-axis beam 7B configure second head moving mechanism 9B for moving second mounting head 8B in the X direction and the Y direction. Hereinafter, for the sake of convenience, first X-axis beam 7A and second X-axis beam 7B are simply referred to as "X-axis beams 7A and 7B" unless it is necessary to distinguish therebetween, first mounting head 8A and second mounting head 8B are simply referred to as "mounting heads 8A and 8B" unless it is necessary to distinguish therebetween, and first head moving mechanism 9A and second head moving mechanism 9B are simply referred to as "head moving mechanisms 9A and 9B" unless it is necessary to distinguish therebetween.

Mounting heads 8A and 8B respectively cause the components to be picked up with the suction nozzles from the component pick-up positions of tape feeders 5 mounted on component suppliers 4A and 4B by the head moving mechanisms 9A and 9B, and move and mount the components to mounting points of boards 3A and 3B positioned in board transport lanes 2A and 2B. As described above, component mounting apparatus 1 includes the plurality of board transport lanes 2A and 2B, the plurality of mounting heads 8A and 8B, and the plurality of component suppliers 4A and 4B provided on the both sides of the plurality of board transport lanes 2A and 2B.

When mounting heads 8A and 8B respectively pick up the components from component suppliers 4A and 4B, the components are picked up and sucked by the suction nozzles respectively mounted on the plurality of suction units 8a, are moved to above boards 3A and 3B which are positioned in board transport lanes 2A and 2B, and then are mounted on a plurality of the mounting points. Therefore, it is possible to reduce the number of mounting turns in which mounting heads 8A and 8B reciprocate between component suppliers 4A and 4B, and boards 3A and 3B, and it is possible to improve the operation efficiency of component mounting.

When the component is picked up from tape feeder 5, the component remaining number held by tape feeder 5 decreases. The component remaining number of each tape feeder 5 is transmitted from tape feeder 5 to controller 20 at a predetermined timing and is stored in storage 21 as component remaining number data 21b (see FIG. 2).

In FIG. 1, first component recognition camera 10A is disposed between first component supplier 4A and first board transport lane 2A. Second component recognition camera 10B is disposed between second component supplier 4B and second board transport lane 2B. Hereinafter, for the sake of convenience, first component recognition camera 10A and second component recognition camera 10B are simply referred to as "component recognition cameras 10A and 10B" unless it is necessary to distinguish therebetween. Component recognition cameras 10A and 10B respectively image the components held by the suction nozzles of mounting heads 8A and 8B when mounting heads 8A and 8B which pick up the components from component suppliers 4A and 4B move upward. An inserting result is recognized by recognition processor 22 (see FIG. 2) of controller 20.

In FIG. 1, first board recognition camera 11A which is positioned on a lower surface side of first X-axis beam 7A and moves integrally with first mounting head 8A is mounted on plate 7a to which first mounting head 8A is attached. Second board recognition camera 11B which is positioned on a lower surface side of second X-axis beam 7B and moves integrally with second mounting head 8B is mounted on plate 7a to which second mounting head 8B is attached. Hereinafter, for the sake of convenience, first board recognition camera 11A and second board recognition camera 11B are simply referred to as "board recognition cameras 11A and 11B" unless it is necessary to distinguish therebetween.

Each of board recognition cameras 11A and 11B moves and integrally with mounting heads 8A and 8B to move above boards 3A and 3B positioned in board transport lanes 2A and 2B and image board marks (not illustrated) provided in boards 3A and 3B. An imaging result is recognized by recognition processor 22 (see FIG. 2) of controller 20.

Figure 2:
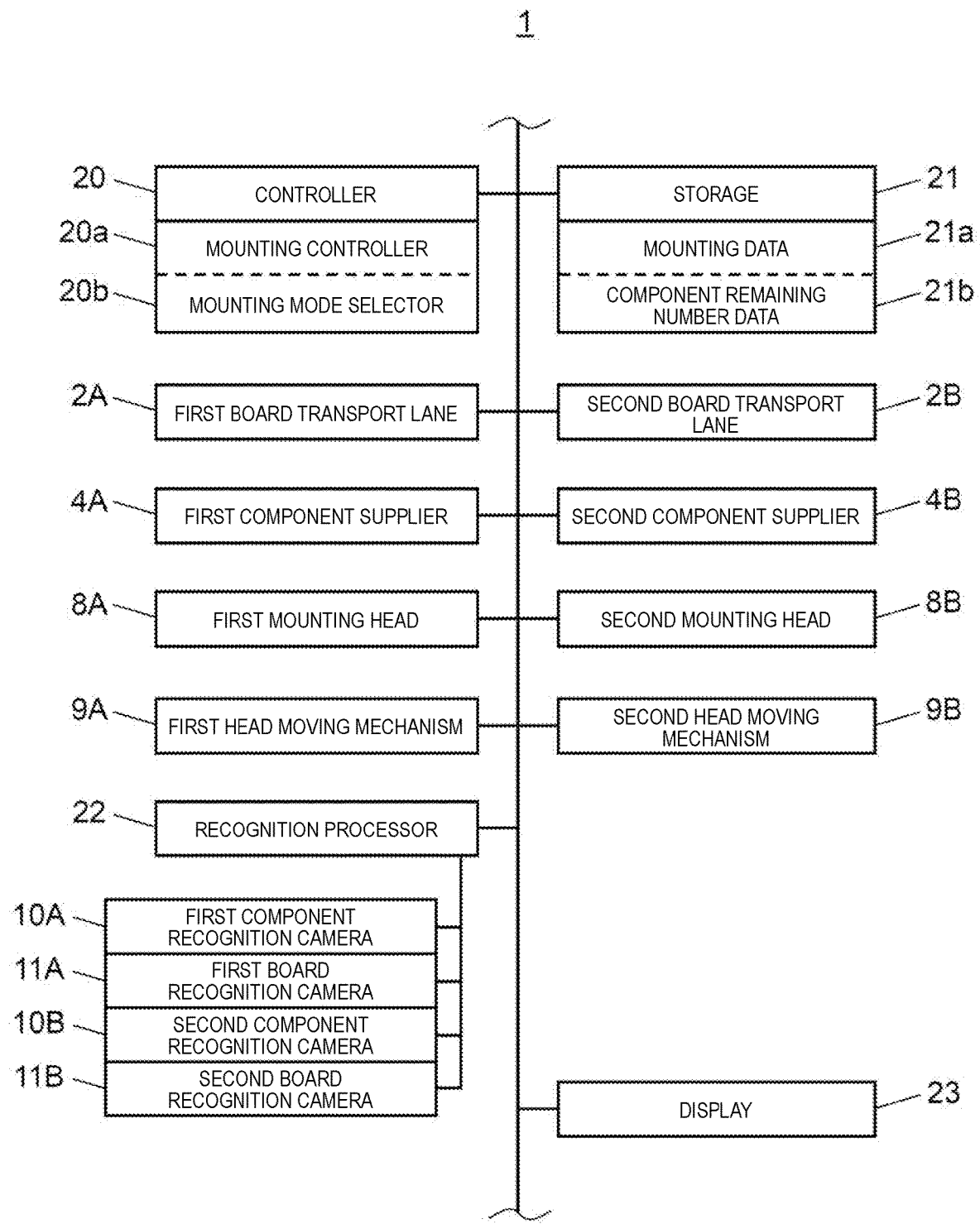
FIG. 2 is a block diagram illustrating a configuration of a control system of the component mounting apparatus of the embodiment.

Next, a configuration of the control system of component mounting apparatus 1 will be described with reference to FIG. 2. FIG. 2 is a block diagram illustrating the configuration of the control system of component mounting apparatus 1. Controller 20 is an entire control device of component mounting apparatus 1 and executes a processing program stored in storage 21 to control each portion of board transport lanes 2A and 2B, component suppliers 4A and 4B, mounting heads 8A and 8B, head moving mechanisms 9A and 9B, and display 23. Display 23 is a liquid crystal display displacing various types of information.

Storage 21 stores various data used for a component mounting operation such as mounting data 21a and component remaining number data 21b. Mounting data 21a is data such as a component type to be mounted and the mounting points in boards 3A and 3B, and is stored for each board type to be produced. Component remaining number data 21b is information of the component remaining number held by each of tape feeders 5 mounted on component suppliers 4A and 4B.

Controller 20 includes recognition processor 22, mounting controller 20a, and mounting mode selector 20b as internal processing functions. Recognition processor 22 recognizes the imaging result by component recognition cameras 10A and 10B, and board recognition cameras 11A and 11B. Mounting controller 20a controls each portion of board transport lanes 2A and 2B, component suppliers 4A and 4B, mounting heads 8A and 8B, and head moving mechanisms 9A and 9B according to a mounting mode selected by mounting mode selector 20b based on mounting data 21a to control the component mounting operation.

Mounting mode selector 20b selects an optimum mounting mode in the component mounting operation from among an independent mounting mode, cross lane alternate mounting mode, and a normally alternate mounting mode based on mounting data 21a, component remaining number data 21b, and the presence or absence of boards 3A and 3B which are positioned and held at the mounting working positions of board transport lanes 2A and 2B.

Here, the mounting modes will be described with reference to FIG. 3.

Figure 3:
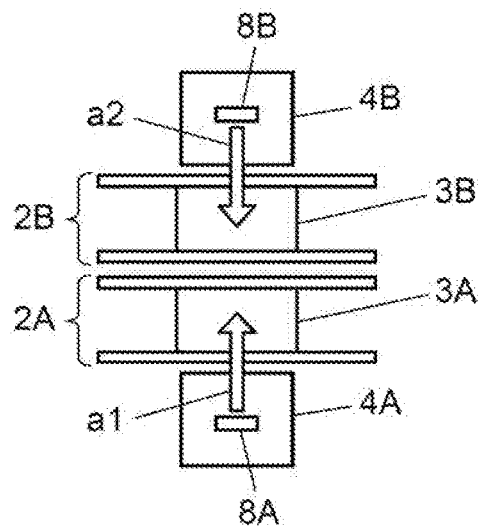
FIG. 3 is an explanatory view of a component mounting method by the component mounting apparatus of the embodiment.
Figure 3:
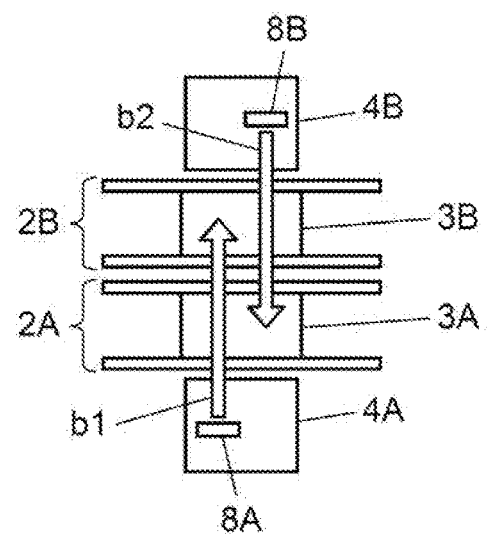
Figure 3:
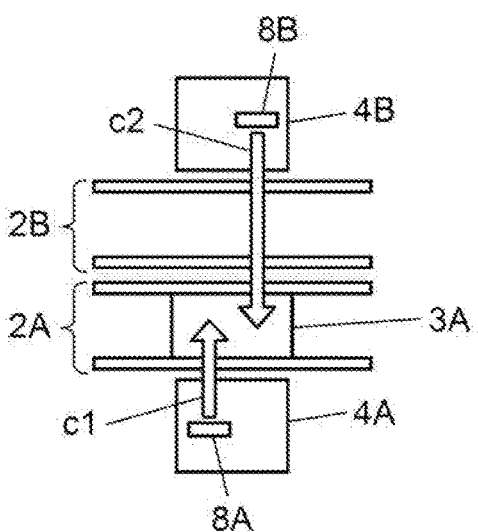

Part (a) of FIG. 3 is an explanatory view of the independent mounting form (independent mounting). Part (b) of FIG. 3 is an explanatory view of the cross lane alternate mounting form (cross lane alternate mounting). Part (c) of FIG. 3 is an explanatory view of the normally alternate mounting form (normally alternate mounting). In parts (a) to (c) of FIG. 3, the operations of mounting heads 8A and 8B, which pick up the components from tape feeders 5 mounted on component suppliers 4A and 4B and mount the components sucked to boards 3A and 3B which are positioned and held at the mounting working positions of board transport lanes 2A and 2B, are displayed by void arrows.

In part (a) of FIG. 3, in the independent mounting mode (independent mounting form), the component is sucked and mounted by first mounting head 8A from tape feeder 5 mounted on first component supplier 4A with respect to first board 3A carried in first board transport lane 2A (arrow a1). In parallel to the operation of first mounting head 8A, the component is sucked and mounted by second mounting head 8B from tape feeder 5 mounted on second component supplier 4B with respect to second board 3B carried in second board transport lane 2B (arrow a2).

That is, in the component mounting operation (independent mounting form) in the independent mounting mode, the operation of sucking and mounting the component by first mounting head 8A among the plurality of mounting heads 8A and 8B from first component supplier 4A on the side close to first board transport lane 2A among the plurality of component suppliers 4A and 4B with respect to first board 3A carried in first board transport lane 2A among the plurality of board transport lanes 2A and 2B, and the operation of sucking and mounting the component by second mounting head 8B among the plurality of mounting heads 8A and 8B from second component supplier 4B on the side far from first board transport lane 2A among the plurality of component suppliers 4A and 4B with respect to second board 3B carried in second board transport lane 2B among the plurality of board transport lanes 2A and 2B are executed independently and in parallel with each other.

In order to execute the component mounting operation in the independent mounting form, it is necessary to satisfy the following conditions. That is, it is necessary to satisfy a condition that tape feeder 5 for supplying the component mounted on first board 3A is disposed in first component supplier 4A and the component remaining number is not zero. Furthermore, it is necessary to satisfy a condition that tape feeder 5 for supplying the component mounted on second board 3B is disposed in second component supplier 4B and the component remaining number is not zero. In the independent mounting form, the timing at which mounting heads 8A and 8B mount the components on boards 3A and 3B is independent of each other and a moving distance of mounting heads 8A and 8B when mounting the components is also short, so that there is an effect that the operation efficiency of component mounting is high.

In part (b) of FIG. 3, in the component mounting operation (cross lane alternate mounting form) in the cross lane alternate mounting mode, the operation (arrow b2) of sucking and mounting the component by second mounting head 8B from second component supplier 4B with respect to first board 3A carried in first board transport lane 2A and the operation (arrow b1) of sucking and mounting the component by first mounting head 8A from first component supplier 4A with respect to second board 3B carried in second board transport lane 2B are alternately executed.

In order to execute the component mounting operation in the cross lane alternate mounting form, it is necessary to satisfy the following conditions. That is, it is necessary to satisfy a condition that at least one type of the component mounted on first board 3A is disposed in second component supplier 4B and the component remaining number is not zero. Furthermore, it is necessary to satisfy a condition that at least one type of the component mounted on second board 3B is disposed in first component supplier 4A and the component remaining number is not zero.

In a case of component mounting in the independent mounting form, component mounting on boards 3A and 3B on the side of component suppliers 4A and 4B in which the component remaining number is zero is interrupted until the components are replenished by a user. However, even if a part of the component remaining number supplied by component suppliers 4A and 4B is zero, component mounting can be performed by the cross lane alternate mounting form if the components are present in component suppliers 4A and 4B on the side far therefrom.

That is, even in a situation where it is inevitable to interrupt the component mounting in the independent mounting form, the component mounting can be constituted by switching the mounting form to the cross lane alternate mounting form. In addition, when mounting the component in the cross lane alternate mounting form, while one of mounting heads 8A and 8B sucks the components in component suppliers 4A and 4B, the other of mounting heads 8A and 8B can mount the components on boards 3A and 3B. Therefore, there is the effect that the operation efficiency of the component mounting is high.

In part (c) of FIG. 3, in the component mounting operation (normally alternate mounting form) in the normally alternate mounting mode, the operation (arrow c1) of sucking and mounting the component by first mounting head 8A from first component supplier 4A with respect to at least one of first board 3A or second board 3B, and the operation (arrow c2) of sucking and mounting the component by second mounting head 8B from second component supplier 4B are alternately executed. Part (c) of FIG. 3 illustrates the normally alternate mounting form with respect to first board 3A.

In order to execute the component mounting operation in the normally alternate mounting form, it is necessary to satisfy the following conditions. That is, it is necessary to satisfy a condition that the component mounted on first board 3A or second board 3B is disposed in at least one of first component supplier 4A and second component supplier 4B, and the component remaining number is not zero.

In the normally alternate mounting form, even in a case where neither the independent mounting form nor the cross lane alternate mounting form cannot be executed, there is an effect that the component mounting to one of boards 3A and 3B can be executed without being interrupted. In addition, when mounting the component in the normally alternate mounting form, while one of mounting heads 8A and 8B sucks the components in component suppliers 4A and 4B, the other of mounting heads 8A and 8B can mount the components on boards 3A and 3B. Therefore, there is the effect that the operation efficiency of the component mounting is high.

In addition, since mounting is performed by two mounting heads 8A and 8B with respect to one of boards 3A and 3B, in a case where only one of boards 3A and 3B is present in component mounting apparatus 1, it is possible to mount the component on one of boards 3A and 3B without idling mounting heads 8A and 8B. In addition, since the components can be supplied from both component suppliers 4A and 4B with respect to one of boards 3A and 3B, the components mounted on boards 3A and 3B may be disposed one of component suppliers 4A and 4B. Therefore, there are fewer restrictions on the number of arrangements of the components than that in the independent mounting form and the degree of freedom of arrangements of the components is high.

Figure 4:
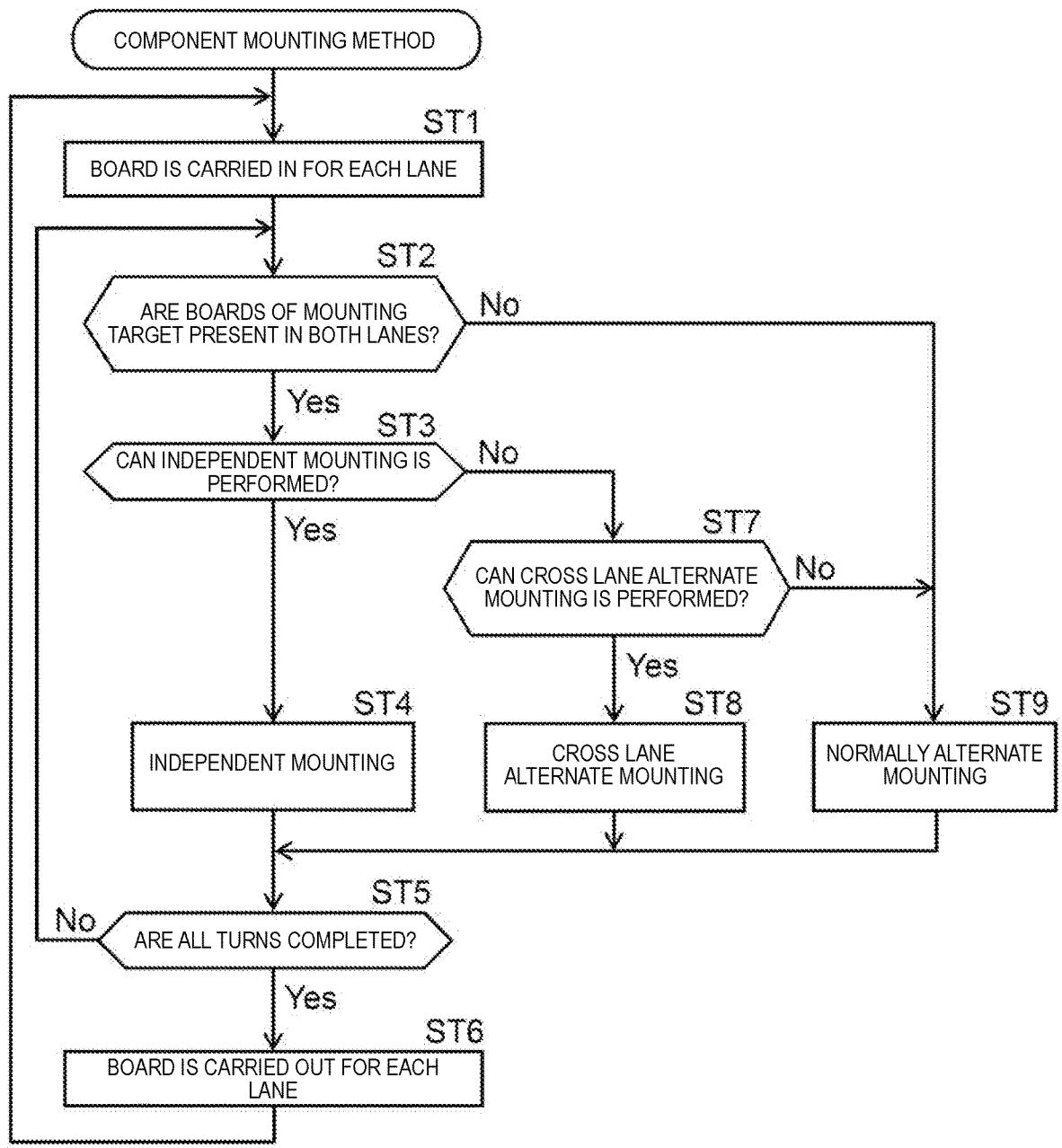
FIG. 4 is a flowchart of the component mounting method by the component mounting apparatus of the embodiment.

Next, the component mounting method in component mounting apparatus 1 will be described with reference to FIG. 4. Mounting heads 8A and 8B pick up the components from component suppliers 4A and 4B depending on the component remaining number supplied by component suppliers 4A and 4B and situations of boards 3A and 3B carried in board transport lanes 2A and 2B. The independent mounting mode, the cross lane alternate mounting mode, and the normally alternate mounting mode are selected and the component mounting operation is executed, and the component mounting operation is executed for each mounting turn in which the pick-up components are mounted on boards 3A and 3B.

First, mounting controller 20a carries boards 3A and 3B in first board transport lane 2A or second board transport lane 2B (ST1: board carrying-in step). In board transport lanes 2A and 2B, each of board transport lanes 2A and 2B asynchronously carries in boards 3A and 3B at a timing at which boards 3A and 3B on which component mounting is completed are carried out. That is, when the component mounting on second board 3B is completed and second board 3B is carried out from second board transport lane 2B, second board 3B of the next mounting target next is carried in second board transport lane 2B without being synchronized with the situation of the component mounting operation on first board 3A.

Next, in executing the component mounting operation of the next mounting turn, mounting mode selector 20b determines whether or not boards 3A and 3B of the mounting targets are present on both board transport lanes 2A and 2B (ST2: mounting target determining step). In a case where boards 3A and 3B are present on both board transport lanes 2A and 2B (Yes in ST2), mounting mode selector 20b determines whether or not independent mounting can be performed (ST3: independent mounting determining step). In a case where it is determined that the independent mounting can be performed (Yes in ST3), mounting mode selector 20b selects the independent mounting mode and mounting controller 20a executes the component mounting operation in the independent mounting form (ST4: independent mounting step).

In the mounting turn, when the component mounting operation is completed in the independent mounting form, next, mounting controller 20a determines whether or not all the mounting turns are completed with respect to boards 3A and 3B of the mounting targets (ST5: all-turn completion determining step). In a case where it is determined that all the mounting turns are completed (Yes in ST5), mounting controller 20a carries boards 3A and 3B, in which all the mounting turns are completed, out from board transport lanes 2A and 2B (ST6: board carry-out step). In the board carry-out step (ST6), similar to the board carry-in step (ST1), the carry-out of boards 3A and 3B is asynchronously executed in each of board transport lanes 2A and 2B. Next, returning to the board carry-in step (ST1), boards 3A and 3B of the next mounting targets are carried in.

In the independent mounting determination step (ST3), in a case where it is determined that independent mounting cannot be performed in both board transport lanes 2A and 2B (No in ST3), mounting mode selector 20b determines whether or not cross lane alternate mounting can be performed (ST7: cross lane alternate mounting determining step). In a case where it is determined that cross lane alternate mounting can be performed (Yes in ST7), mounting mode selector 20b selects cross lane alternate mounting and mounting controller 20a executes the component mounting operation in the cross lane alternate mounting form (ST8: cross lane alternate mounting step). Next, the process proceeds to the all-turn completion determining step (ST5) and it is determined whether or not all the mounting targets are completed with respect to boards 3A and 3B to be mounted.

As described above, in a case where the independent mounting form can be performed (Yes in ST3), the independent mounting form is executed (ST4) and in a case where the independent mounting form cannot be executed (No in ST3) and the cross lane alternate mounting form can be performed (Yes in ST7), the cross lane alternate mounting form is executed (ST8). That is, the independent mounting form having a higher operation efficiency of the component mounting than the cross lane alternate mounting form is preferentially selected.

In a case where it is determined that boards 3A and 3B are present only in one of board transport lanes 2A and 2B in the mounting target determining step (ST2) (No in ST2), or in a case where it is determined that the cross lane alternate mounting cannot be performed in the cross lane alternate mounting determining step (ST7) (No in ST7), mounting mode selector 20b selects the normally alternate mounting and mounting controller 20a executes the component mounting operation in the normally alternate mounting form (ST9: normally alternate mounting step).

That is, in a case where neither the independent mounting form nor the cross lane alternate mounting form cannot be performed (No in ST2 or No in ST3 and ST7), the normally alternate mounting form is executed. Next, the process proceeds to the all-turn completion determining step (ST5) and it is determined whether or not all the mounting turns are completed with respect to boards 3A and 3B of the mounting targets.

As described above, in component mounting apparatus 1, it is determined (selected) which one of the plurality of the mounting forms including the independent mounting form and the cross lane alternate mounting form is executed for each mounting turn, and each mounting form is executed with respect to first board 3A and second board 3B. It is possible to efficiently manufacture the mounting board by flexibly coping with the carry-in timing of boards 3A and 3B or the component remaining number that is changed every second by selecting the mounting form for each mounting turn.

Figure 5:
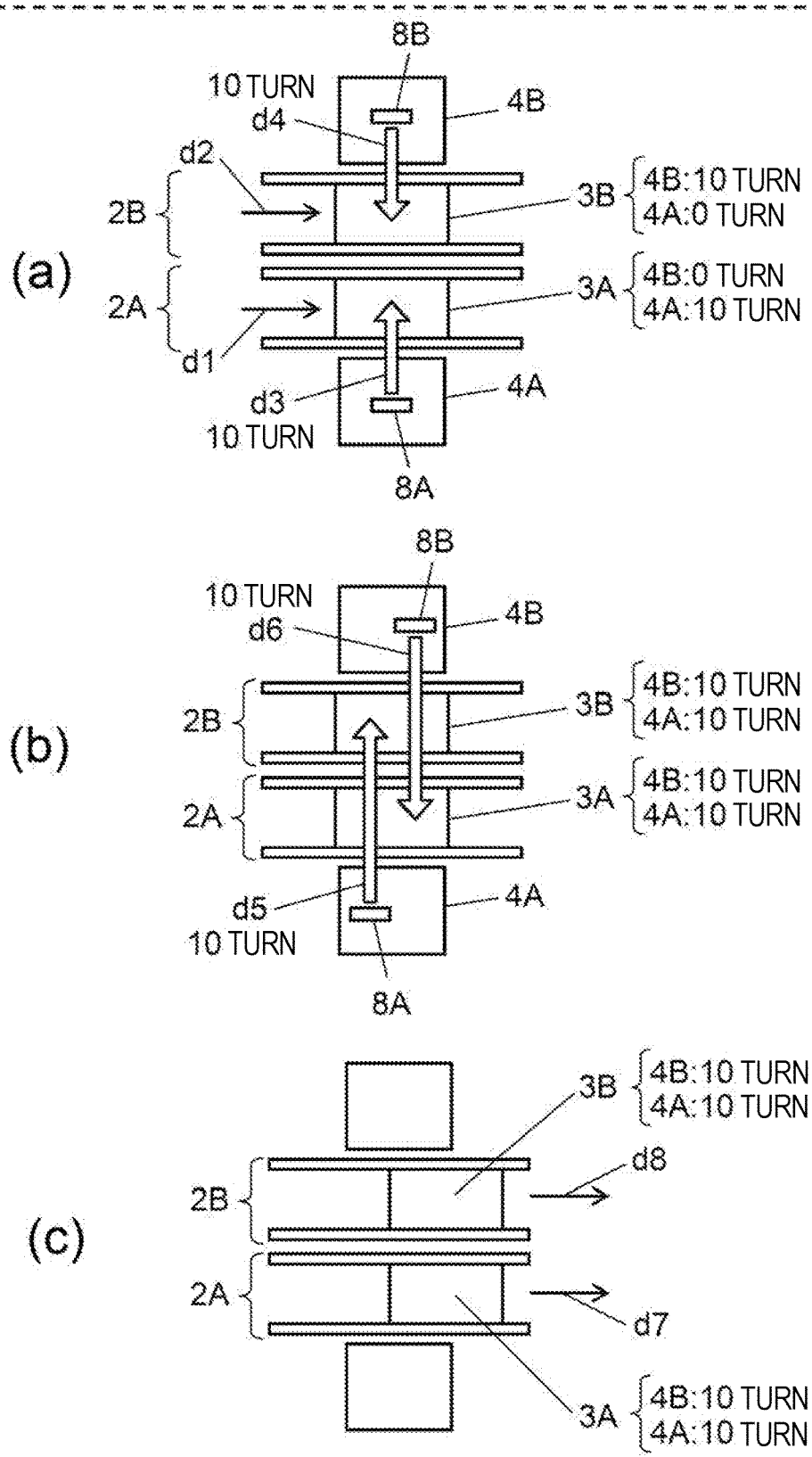
FIG. 5 is an explanatory view illustrating a first example of component mounting by the component mounting apparatus of the embodiment.

Next, an example in which the component mounting is performed by selecting the mounting form for each mounting turn by component mounting apparatus 1 will be described with reference to FIGS. 5 to 10. FIG. 5 is an explanatory view illustrating a first example of the component mounting by component mounting apparatus 1.

FIG. 5 illustrates a first example in which the components of total 20 mounting turns are mounted on first board 3A and the components of total 20 mounting turns are mounted on second board 3B. In part (a) of FIG. 5, first board 3A of the mounting target is carried in first board transport lane 2A (arrow d1) and second board 3B of the mounting target is carried in second board transport lane 2B (arrow d2).

Here, in first board 3A and second board 3B, it is determined that the independent mounting cannot be performed in all the mounting turns, but the independent mounting can be performed in 10 mounting turns. In this case, in the initial 10 mounting turns, the independent mounting, in which first mounting head 8A picks up the component from first component supplier 4A and mounts the component on first board 3A (arrow d3), and second mounting head 8B picks up the component from second component supplier 4B and mounts the component on second board 3B (arrow d4), is executed.

Next, in part (b) of FIG. 5, in the remaining 10 mounting turns, the cross lane alternate mounting, in which first mounting head 8A picks up the component from first component supplier 4A and mounts the component on second board 3B (arrow d5), and second mounting head 8B picks up the component from second component supplier 4B and mounts the component on first board 3A (arrow d6), is executed. Next, in part (c) of FIG. 5, first board 3A on which the component mounting is completed is carried out from first board transport lane 2A (arrow d7) and second board 3B on which the component mounting is completed is carried out from second board transport lane 2B (arrow d8).

Next, a second example of the component mounting by component mounting apparatus 1 will be described with reference to FIGS. 6 and 7. The second example differs from the first example in that the carry-in timing of first board 3A and second board 3B is shifted (asynchronous). In part (a) of FIG. 6, first, first board 3A of the mounting target is carried in first board transport lane 2A (arrow e1). Next, the normally alternate mounting, in which first mounting head 8A picks up the components of 3 mounting turns from first component supplier 4A and mounts the components on first board 3A (arrow e2) and second mounting head 8B picks up the component from second component supplier 4B and mounts the component on first board 3A (arrow e3), is executed.

Figure 6:
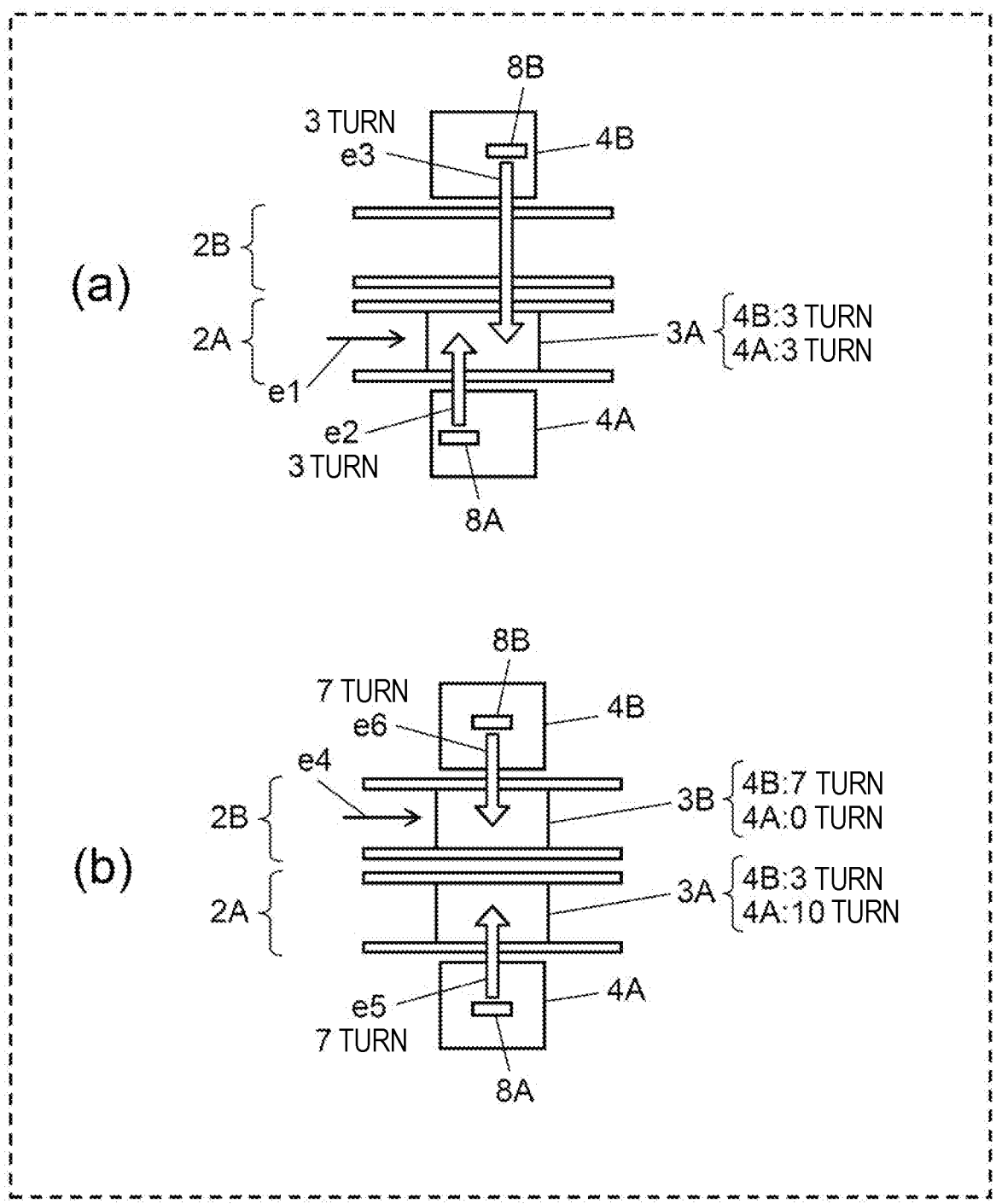
FIG. 6 is an explanatory view illustrating a second example of component mounting by the component mounting apparatus of the embodiment.

Next, in part (b) of FIG. 6, second board 3B of the mounting target is carried in second board transport lane 2B (arrow e4). In this state, in the next 7 mounting turns, the independent mounting, in which first mounting head 8A picks up the component from first component supplier 4A and mounts the component on first board 3A, is executed (arrow e5), and the independent mounting, in which second mounting head 8B picks up the component from second component supplier 4B and mounts the component on second board 3B (arrow e6), is executed.

Figure 7:
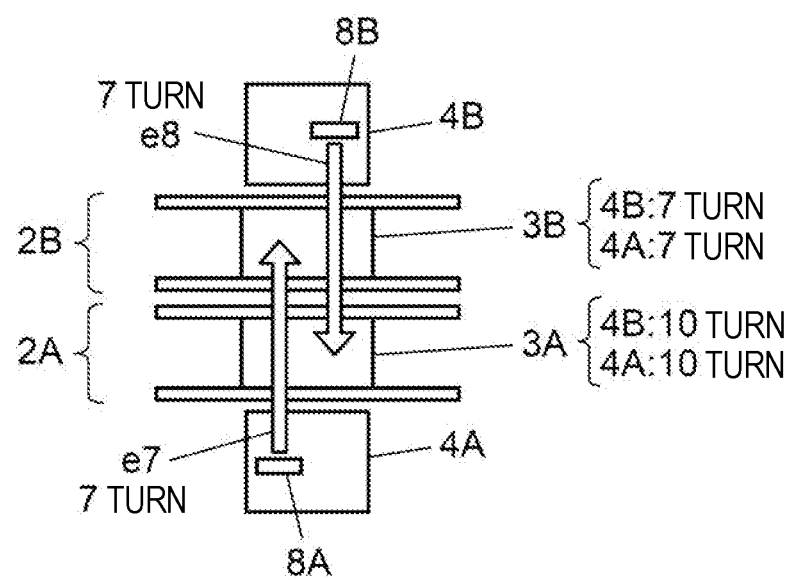
FIG. 7 is an explanatory view illustrating the second example of component mounting by the component mounting apparatus of the embodiment.
Figure 7:
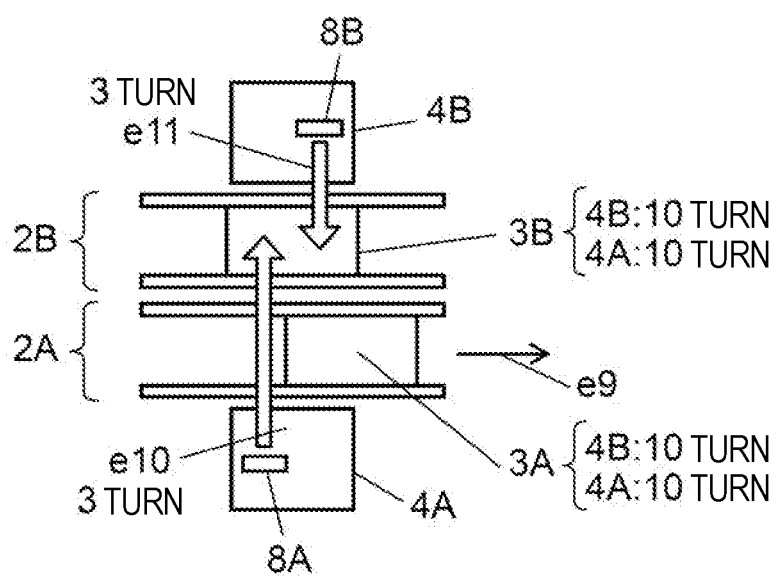

Next, in part (a) of FIG. 7, in the next 7 mounting turns, the cross lane alternate mounting, in which first mounting head 8A picks up the component from first component supplier 4A and mounts the component on second board 3B (arrow e7), and second mounting head 8B picks up the component from second component supplier 4B and mounts the component on first board 3A (arrow e8), is executed.

Next, in part (b) of FIG. 7, first board 3A on which the component mounting is completed is carried out from first board transport lane 2A (arrow e9). In second board transport lane 2B, the normally alternate mounting, in which first mounting head 8A picks up the components of 3 mounting turns from first component supplier 4A and mounts the components on second board 3B (arrow e10), and second mounting head 8B picks up the component from second component supplier 4B and mounts the component on second board 3B (arrow e11), is executed asynchronously with first board transport lane 2A. Thereafter, second board 3B on which the component mounting is completed is carried out (not illustrated) from second board transport lane 2B.

Next, a third example of the component mounting by component mounting apparatus 1 will be described with reference to FIG. 8. The third example differs from the first example in that the components of total 10 mounting turns are mounted on second board 3B and the number of the components to be mounted is different from that of first board 3A. In part (a) of FIG. 8, first board 3A of the mounting target is carried in first board transport lane 2A (arrow f1) and second board 3B of the mounting target is synchronously carried in second board transport lane 2B (arrow f2). Next, in the initial 5 mounting turns, the independent mounting, in which first mounting head 8A picks up the component from first component supplier 4A and mounts the component on first board 3A (arrow f3), and second mounting head 8B picks up the component from second component supplier 4B and mounts the component on second board 3B (arrow f4), is executed.

Figure 8:
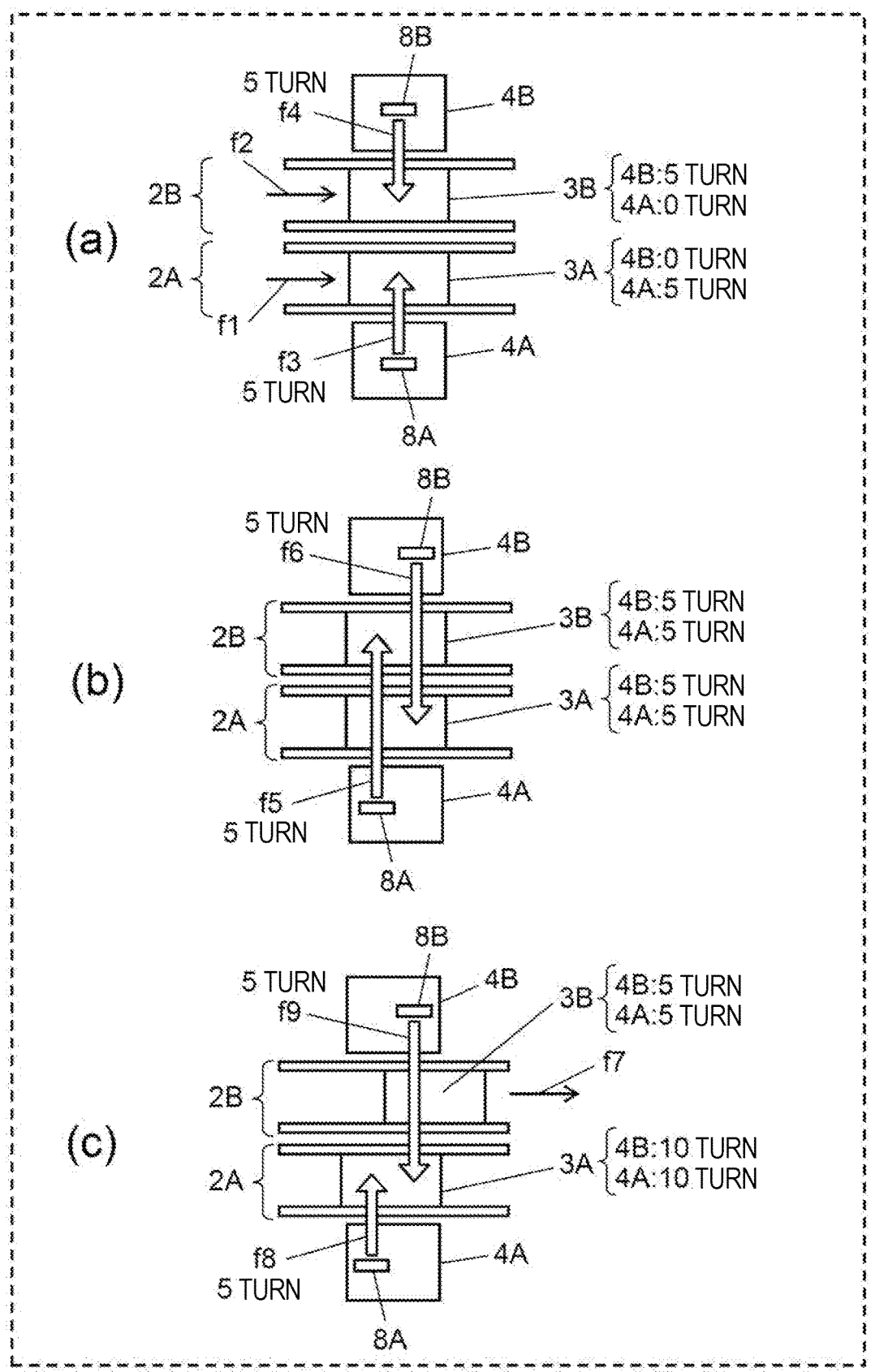
FIG. 8 is an explanatory view illustrating a third example of component mounting by the component mounting apparatus of the embodiment.

Next, in part (b) of FIG. 8, in the next 5 mounting turns, the cross lane alternate mounting, in which first mounting head 8A picks up the component from first component supplier 4A and mounts the component on second board 3B (arrow f5), and second mounting head 8B picks up the component from second component supplier 4B and mounts the component on first board 3A (arrow f6), is executed.

Next, in part (c) of FIG. 8, second board 3B on which the component mounting is completed is carried out from second board transport lane 2B (arrow f7). In first board transport lane 2A, the normally alternate mounting, in which first mounting head 8A picks up the components of 5 mounting turns from first component supplier 4A and mounts the components on first board 3A (arrow f8), and second mounting head 8B picks up the components from second component supplier 4B and mounts the components on first board 3A (arrow f9), is executed asynchronously with second board transport lane 2B. Thereafter, first board 3A on which the component mounting is completed is carried out (not illustrated) from first board transport lane 2A.

Next, a fourth example of the component mounting by component mounting apparatus 1 will be described with reference to FIGS. 9 and 10. The fourth example differs from the third example in that the carry-in timing of first board 3A and second board 3B is shifted (asynchronous). Next, in part (a) of FIG. 9, first, first board 3A of the mounting target is carried in first board transport lane 2A (arrow g1). Next, the normally alternate mounting, in which first mounting head 8A picks up the components of 3 mounting turns from first component supplier 4A and mounts the components on first board 3A (arrow g2) and second mounting head 8B picks up the component from second component supplier 4B and mounts the component on first board 3A (arrow g3), is executed.

Figure 9:
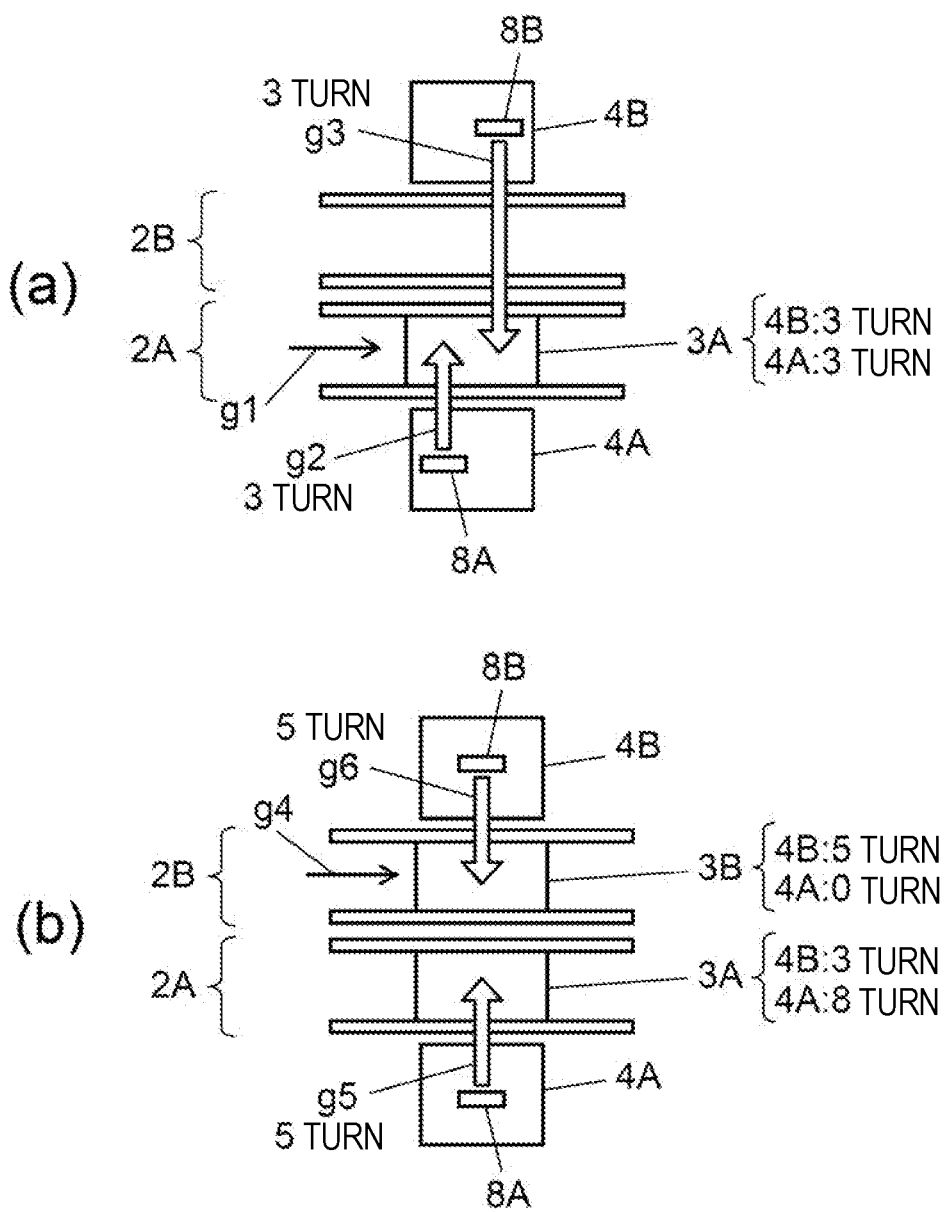
FIG. 9 is an explanatory view illustrating a fourth example of component mounting by the component mounting apparatus of the embodiment.

Next, in part (b) of FIG. 9, second board 3B of the mounting target is carried in second board transport lane 2B (arrow g4). In this state, in the next 5 mounting turns, the independent mounting, in which first mounting head 8A picks up the component from first component supplier 4A and mounts the component on first board 3A, is executed (arrow g5), and the independent mounting, in which second mounting head 8B picks up the component from second component supplier 4B and mounts the component on second board 3B (arrow g6), is executed.

Figure 10:
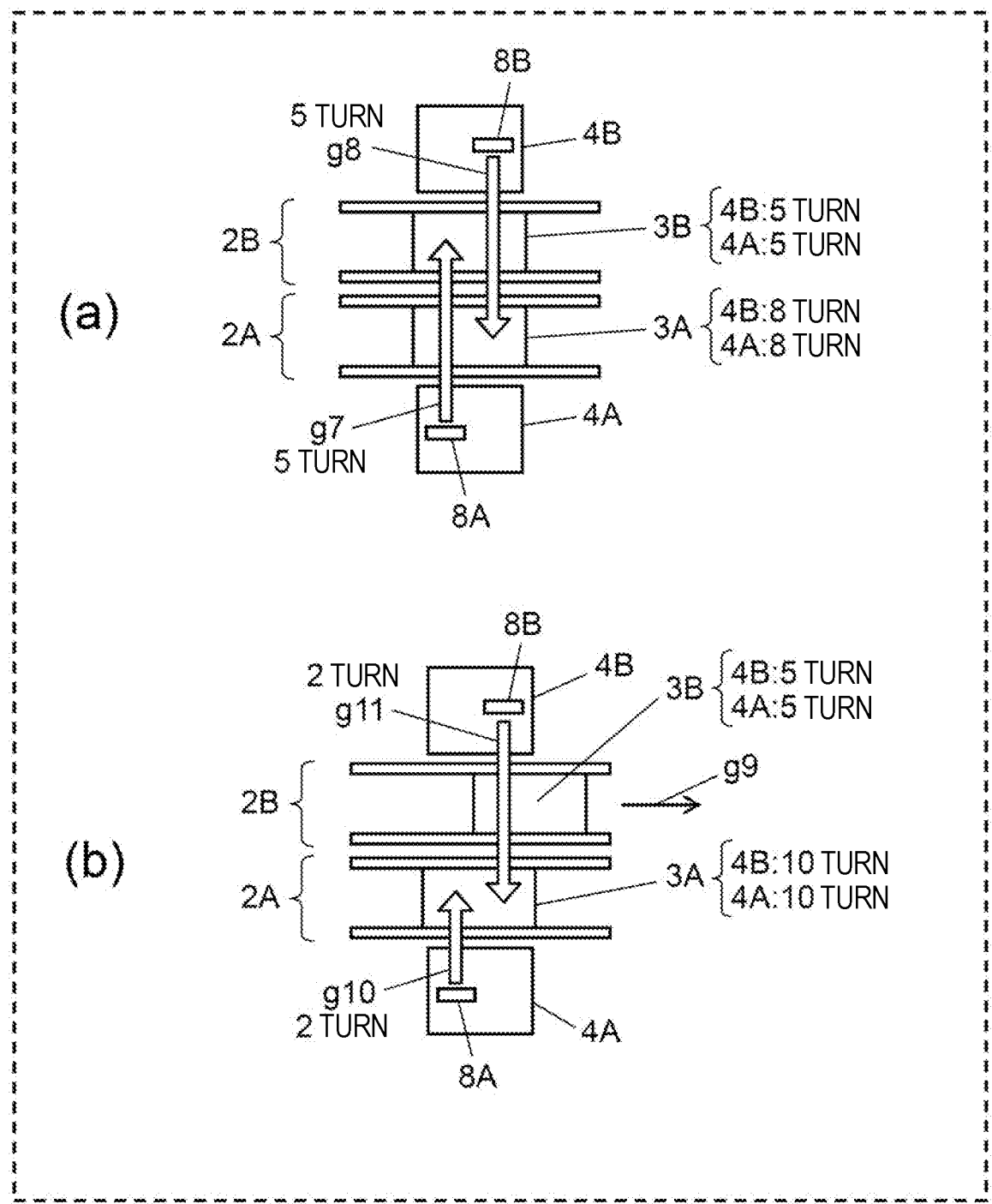
FIG. 10 is an explanatory view illustrating the fourth example of component mounting by the component mounting apparatus of the embodiment.

Next, in part (a) of FIG. 10, in the next 5 mounting turns, the cross lane alternate mounting, in which first mounting head 8A picks up the component from first component supplier 4A and mounts the component on second board 3B (arrow g7), and second mounting head 8B picks up the component from second component supplier 4B and mounts the component on first board 3A (arrow g8), is executed, Next, in part (b) of FIG. 10, second board 3B on which the component mounting is completed is carried out from second board transport lane 2B (arrow g9). In first board transport lane 2A, the normally alternate mounting, in which first mounting head 8A picks up the components of 2 mounting turns from first component supplier 4A and mounts the components on first board 3A (arrow g10), and second mounting head 8B picks up the component from second component supplier 4B and mounts the component on first board 3A (arrow g11), is executed asynchronously with second board transport lane 2B. Thereafter, first board 3A on which the component mounting is completed is carried out (not illustrated) from first board transport lane 2A.

As described above, the component mounting method of the embodiment executes each mounting form of the independent mounting form and the cross lane alternate mounting form with respect to first board 3A and second board 3B. Therefore, it is possible to efficiently manufacture the mounting board.

More specifically, in general, in order to perform the component mounting in the independent mounting form, it is necessary to dispose all the components to be mounted on boards 3A and 3B transported to each of board transport lanes 2A and 2B are disposed in component suppliers 4A and 4B on the side close to each of board transport lanes 2A and 2B. Therefore, the number of tape feeders 5 which can be used in the mounting operation with respect to boards 3A and 3B transported to one of board transport lanes 2A and 2B is limited within a range of the number of tape feeders 5 which can be disposed in one of component suppliers 4A and 4B.

However, the components to be mounted on boards 3A and 3B transported to one of board transport lanes 2A and 2B may be disposed in one of both component suppliers 4A and 4B by combining the independent mounting form and the cross lane alternate mounting form as in the embodiment. Therefore, the degree of freedom of the number of the components or arrangements of the components is increased. In addition, since the component mounting is performed in the independent mounting form as much as possible, high productivity can be obtained as compared to a case where the component mounting on boards 3A and 3B is performed in the normally alternate mounting form in all mounting turns.

As described above, according to the disclosure, it is possible to efficiently manufacture the mounting board. The component mounting method of the disclosure has an effect that it is possible to efficiently manufacture the mounting board, and is useful in a field of mounting the component on the board.

What is claimed is:

1. A component mounting method in a component mounting apparatus including
   a first board transport lane,
   a first mounting head,
   a second board transport lane which is disposed along the first board transport lane,
   a second mounting head,
   a first component supplier which is disposed closer to the first board transport lane than to the second board transport lane, and
   a second component supplier which is disposed closer to the second board transport lane than to the first board transport lane,
   the method comprising:
   independent mounting of independently performing
      an operation of sucking a component from the first component supplier by the first mounting head, and mounting the component on a first board carried in the first board transport lane, and
      an operation of sucking a component from the second component supplier by the second mounting head, and mounting the component on a second board carried in the second board transport lane; and
   cross lane alternate mounting of alternately performing
      an operation of sucking a component from the second component supplier by the second mounting head, and mounting the component on the first board carried in the first board transport lane, and
      an operation of sucking a component from the first component supplier by the first mounting head, and mounting the component on the second board carried in the second board transport lane.

2. The component mounting method of claim 1,
   wherein in a case where the independent mounting is capable of being executed, the independent mounting is executed, and
   wherein in a case where the independent mounting is not capable of being executed and the cross lane alternate mounting is capable of being executed, the cross lane alternate mounting is executed.

3. The component mounting method of claim 2,
   wherein for each mounting turn in which the first mounting head and the second mounting head mount the components on the first board and the second board,
   determining which of the independent mounting and the cross lane alternate mounting is executed.

4. The component mounting method of claim 2, further comprising:
   normally alternate mounting that alternately performs, for any one of the first board and the second board,
      an operation of sucking and mounting a component from the first component supplier by the first mounting head, and
      an operation of sucking and mounting a component from the second component supplier by the second mounting head.

5. The component mounting method of claim 1,
   wherein for each mounting turn in which the first mounting head and the second mounting head mount the components on the first board and the second board,
   determining which of the independent mounting and the cross lane alternate mounting is executed.

6. The component mounting method of claim 1, further comprising:
   normally alternate mounting that alternately performs, for at least any one of the first board and the second board,
   an operation of sucking and mounting a component from the first component supplier by the first mounting head, and
   an operation of sucking and mounting a component from the second component supplier by the second mounting head.

* * * * *